United States Patent
Xu et al.

(10) Patent No.: US 10,006,806 B2
(45) Date of Patent: Jun. 26, 2018

(54) LIGHT SENSOR ARRANGEMENT AND METHOD FOR TEMPERATURE COMPENSATION IN A LIGHT SENSOR ARRANGEMENT

(71) Applicant: ams AG, Unterpremstätten (AT)

(72) Inventors: Gonggui Xu, Plano, TX (US); Lloyd Hasley, Plano, TX (US); Cecil Aswell, Orangevale, CA (US); Mario Manninger, Unterpremstätten (AT)

(73) Assignee: ams AG, Unterpremstaetten (AT)

( * ) Notice: Subject to any disclaimer, the term of this patent is extended or adjusted under 35 U.S.C. 154(b) by 598 days.

(21) Appl. No.: 14/067,862

(22) Filed: Oct. 30, 2013

(65) Prior Publication Data
US 2014/0117215 A1 May 1, 2014

Related U.S. Application Data

(60) Provisional application No. 61/720,776, filed on Oct. 31, 2012.

(30) Foreign Application Priority Data

Nov. 2, 2012 (EP) ..................... 12191084

(51) Int. Cl.
*G01J 1/44* (2006.01)
*G01J 1/16* (2006.01)
(Continued)

(52) U.S. Cl.
CPC .............. *G01J 1/44* (2013.01); *G01J 1/1626* (2013.01); *G01J 1/4204* (2013.01);
(Continued)

(58) Field of Classification Search
CPC . H01L 31/02164; H01L 31/00; H01L 27/144; H01L 31/107; G01J 1/4228;
(Continued)

(56) References Cited

U.S. PATENT DOCUMENTS 6,596,981 B1    7/2003  Aswell et al.
2003/0132369 A1*  7/2003  Aswell ............... H01L 27/1446
                                                          250/214.1

(Continued)

FOREIGN PATENT DOCUMENTS

EP            1863091 A2    12/2007

*Primary Examiner* — Georgia Y Epps
*Assistant Examiner* — Don Williams
(74) *Attorney, Agent, or Firm* — McDermott Will & Emery LLP

(57) ABSTRACT

A light sensor arrangement according to the proposed principle comprises at least one first unshielded well (D0) and at least one second shielded well (D1) in a substrate (P). The at least one first unshielded well (D0) is being exposed to incident light (λ) and configured to generate a first sensor signal (Ch0) as a function of the incident light (λ). The at least one second shielded well (D1) in the substrate (p) being shielded from the incident light (λ) and configured to generate a second sensor signal (Ch1) as a function of the incident light (λ). The light sensor arrangement further comprises means for temperature compensation providing the first and second sensor signals (Ch0, Ch1) as temperature compensated sensor signals as a function of substrate temperature. Means to determine spectral content of the incident light (λ) are provided to determine the spectral content as a function of the temperature compensated first and second sensor signals (Ch0, Ch1).

19 Claims, 4 Drawing Sheets

(51) Int. Cl.
*H01L 27/144* (2006.01)
*H01L 31/0216* (2014.01)
*G01J 1/42* (2006.01)

(52) U.S. Cl.
CPC ........ *G01J 1/4228* (2013.01); *H01L 27/1443* (2013.01); *H01L 31/02164* (2013.01); *G01J 2001/4247* (2013.01)

(58) Field of Classification Search
CPC .......... G01J 1/4204; G01J 1/1626; G01J 5/22; G01J 1/44; G01J 2001/466
USPC ..... 250/208.1, 214.1, 214 C, 214 AL, 214 B
See application file for complete search history.

(56) References Cited

U.S. PATENT DOCUMENTS

| | | | | |
|---|---|---|---|---|
| 2008/0000893 | A1* | 1/2008 | Wittenhagen | H05B 3/748 219/446.1 |
| 2009/0014653 | A1* | 1/2009 | Parrish | G01J 5/24 250/338.1 |
| 2009/0140125 | A1 | 6/2009 | Takayama | |
| 2009/0213895 | A1* | 8/2009 | Pillans | G01J 5/24 374/2 |
| 2010/0301194 | A1* | 12/2010 | Patel | G01J 1/18 250/208.2 |

* cited by examiner

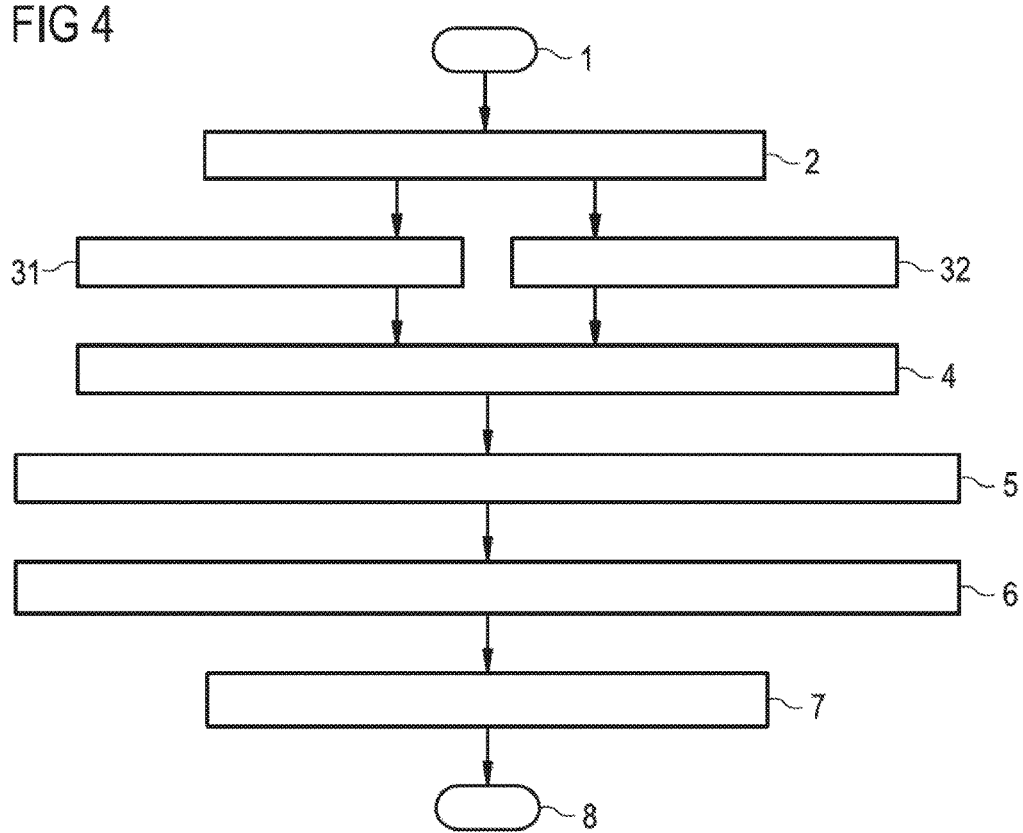

LIGHT SENSOR ARRANGEMENT AND METHOD FOR TEMPERATURE COMPENSATION IN A LIGHT SENSOR ARRANGEMENT

CROSS-REFERENCE TO RELATED APPLICATIONS

The present application claims the benefit of U.S. Provisional Patent Application No. 61/720,776, filed on Oct. 31, 2012, and claims priority to European Patent Application No. 12191084.8 filed on Nov. 2, 2012, both disclosures of which are hereby incorporated by reference in their entirety for all purposes.

SUMMARY

This invention relates to a light sensor arrangement and to a method for temperature compensation in a light sensor arrangement.

Ambient light sensors are widely used in back light control modules for display devices. The principle of ambient light sensor operation is to generate an ambient light brightness signal (in terms of lux), just as perceived by human eyes, also called photopic response. Based on this lux value, the back light control modules dynamically adjust the display brightness levels in order to save power.

In a conventional ambient light sensor, two closely spaced photodiodes are used to detect ambient light as a function of light induced photo-currents. The two diodes can be implemented by means of closely spaced n-type wells in a p-type substrate in a CMOS process. The photo-currents are typically combined together in the digital domain by a complex lux equation to get the photopic contents of the incident light.

Such sensors, however, are very sensitive to pn-junction temperature. The spectral response, i.e. the amount of photo-currents generated by the photodiode highly depends on ambient temperature. Furthermore, the sensors are mounted on printed circuit boards (PCB) and use flex cables connections. These components often have higher temperature than the ambient environment. In order to establish a photopic response of an ambient light sensor accurate spectral content of the ambient light has to be recorded and modelled into the lux equations.

Thus, there is a need in the art to provide for a light sensor arrangement and a method for temperature compensation in a light sensor arrangement having improved detection accuracy under temperature variations.

The above object is solved by the subject-matter of the independent claims. Further developments and embodiments are subject-matter of the dependent claims.

According to one aspect of the invention, a light sensor arrangement comprises at least one first unshielded well in a substrate and at least one second shielded well in the same substrate. The first and second wells form photodiodes in the substrate. The first and second wells are preferably arranged along a common surface of the substrate and are covered by a mask, for example made from metal or plastic. It is further preferred that first and second wells are situated side-by-side in the substrate. The at least one first unshielded well is exposed to incident light, e.g. by means of the mask or similar constructions. On the other side the at least one second shielded well is shielded from the incident light.

The principle of operation, as will be described below, is based on at least one unshielded and one shielded well. It is possible, however, that more than the two wells are implemented into the common substrate.

The incident light is emitted from a given light source. Such a light source may comprise fluorescent light, incandescent light or sunlight. Under exposure to the incident light the first unshielded well generates a first sensor signal as a function of the incident light. This first sensor signal is generated by absorption of light photons in the material of the first well. Therefore, the signal may comprise components of different wavelengths, for example visible light and infrared light. The second shielded well is configured to generate a second sensor signal as a function of the incident light. As the second shielded well is shielded from the incident light it cannot generate a sensor signal by direct absorption as the unshielded well can. The origin of this second sensor signal is from indirect pathways to the well structure via the substrate. For example, infrared photons may penetrate into the substrate and are absorbed underneath the shielded well. By way of diffusion, minority carriers which are generated in the course of the absorption may diffuse towards the shielded well and lead to the generation of the second sensor signal.

The proposed light sensor arrangement also comprises a means for temperature compensation. The spectral response and, more particularly, the absorption depth of photons of different wavelength, is a function of temperature. Therefore, the amount of first and second sensor signals will depend not only on wavelength, but on temperature as well. The means for temperature compensation are designed to provide the first and second sensor signals as temperature-compensated sensor signals as a function of substrate temperature.

The term "means for temperature compensation" is used in a broad way hereinafter. It may comprise separate units such as sensors and processing units to establish temperature compensation by means of signal processing. However, as shown below, the structure of the substrate can be adjusted to provide for a structural temperature compensation without the need of further signal processing. The two approaches can also be used in combination.

Furthermore, the light sensor arrangement comprises means to determine spectral content of the incident light. The means to determine spectral content consider the temperature-compensated first and second sensor signals which are indicative of spectral information such as the type of light source which emitted the incident light in the first place.

The temperature compensation results in higher accuracy for ambient light detection. In particular, the proposed temperature compensation and spectral content determination results in improved photopic response. The higher accuracy allows for extending the light sensor arrangement over a wider temperature range and opens up a wider application markets.

According to another aspect of the invention, the means for temperature compensation comprise a temperature sensor. The temperature sensor is designed to generate a temperature signal depending on the substrate temperature.

According to another aspect of the invention, the temperature sensor comprises a temperature diode comprising a third well in the substrate. The wells may use the same junction, in particular a pn-junction, or same kind of junction, in the same substrate. Therefore, the different sensors, i.e. first and second well and the temperature sensor are integrated in the same die. Therefore, photodiodes may collect their respective sensor signals at the same or similar time as when the temperature sensor collects a temperature signal. Hereinafter the term "junction" denotes a boundary between two semiconductor materials, in particular between a p-type and n-type semiconductor created in a single crystal of semiconductor.

According to another aspect of the invention, the third well is of the same type as the first and second well in the substrate. In this implementation it may even be possible to use one of the shielded wells as temperature sensor.

According to another aspect of the invention, the means for temperature compensation comprise a processing unit and a memory. The processing unit preferably comprises a microprocessor or logic. The memory is connected to the processing unit. The processing unit is coupled to the temperature sensor on one side and to the at least one first and second well via the substrate on the other side. The memory preferably comprises a read only memory, random access memory or other volatile or non-volatile types of memory.

The memory is configured to store predetermined calibration data referenced as a function of a reference temperature. The calibration data is accessible based on the measurement of first and second sensor signals as well as the substrate temperature.

The calibration process is managed by the processing unit. The processing unit receives the temperature signal as well as the first and second sensor signal. The processing unit comprises calculation means to determine a signal ratio from the first and second sensor signal. The processing unit further comprises selection means which are configured to select calibration data from the memory as a function of the determined signal ratio and as a function of the reference temperature. The processing unit also comprises calibration means to provide a temperature-compensated signal ratio and the temperature-compensated first and second sensor signal. Calibration is performed based on the selected calibration data. Calibration may comprise mathematical or arithmetic operations.

According to another aspect of the invention, the substrate is coupled to the processing unit via an analog-to-digital converter. The processing unit comprises a digital signal processor. Furthermore, the memory comprises digital memory.

By using digital components a digital compensation scheme is established. This scheme provides the user with more freedom for different calculation schemes which may further acknowledge different ambient light conditions.

According to another aspect of the invention, the memory comprises a table of calibration data. In addition, or alternatively, a calibration formula is stored into the memory to generate the calibration data. The table and/or formula are readable by means of the processing unit.

According to another aspect of the invention, the means to determine spectral content comprise a calculation unit. The calculation unit is connected to the processing unit to receive the compensated signal ratio and the temperature-compensated first and second signal. The calculation unit is configured to determine from the temperature-compensated signal ratio and as a function of a temperature-compensated first and second signal a type of light source emitting the incident light and/or a lux value of the incident light.

According to another aspect of the invention, the means for temperature compensation comprise the substrate. A light sensor arrangement according to the principle outlined below may omit the need for separate temperature sensor by structural design. However, the light sensor presented with structural temperature compensation means can be further added with the temperature sensor as outlined above.

In this respect, the substrate has a depth adjusted to the absorption distance of the incident light in the substrate material. The substrate depth is chosen to be larger than the absorption distance at a predetermined wavelength of the incident light and at a predetermined substrate temperature.

According to another aspect of the invention, the first, second and third well comprise an n-type semiconductor and the substrate comprises a p-type semiconductor. The pn-junction between well structures and the substrate establishes a diode, in particular, a photodiode for first and second well and a temperature diode for the third well, respectively.

According to an aspect of the invention, a method for temperature compensation in a light sensor arrangement comprises the step of acquiring a first sensor signal by means of at least one first unshielded well in a substrate being exposed to incident light. In addition, a second sensor signal is acquired by means of at least one second shielded well in the substrate being shielded from the incident light. The first and second sensor signals are provided as temperature-compensated first and second sensor signals as a function of substrate temperature. Finally, a spectral content of the incident light as a function of the temperature-compensated first and second sensor signals is determined.

The temperature compensation results in higher accuracy for ambient light detection. In particular, the proposed temperature compensation and spectral content determination results in improved photopic response. The higher accuracy allows for extending using a light sensor arrangement over a wider temperature range and opens up a wider application markets.

According to another aspect of the invention the substrate temperature is determined either in parallel to acquiring the first and second sensor signal or during a temperature measurement mode of operation alternating with the acquisition of the first and second sensor signal.

According to another aspect of the invention, a signal ratio is calculated from the first and second sensor signal. Then, calibration data is selected from a predetermined table and/or formula, referenced as a function of the signal ratio and of a reference temperature. The selection is done depending on the signal ratio and substrate temperature. Then, a temperature-compensated signal ratio is provided and the temperature-compensated first and second sensor signals are based on the selected calibration data.

According to another aspect of the invention, the temperature compensated signal ratio is determined and a type of light source emitting the light per incident light is established. In addition, or alternatively, the temperature-compensated signal ratio is determined and, as a function of the temperature compensated first and second sensor signal the lux value of the incident light is determined.

According to another aspect of the invention, the determination of the type of light source emitting the incident light further comprises considering the second sensor signal of the at least one second shielded well.

The second sensor signal records most of longer wavelength incident light. The sensor response is most sensitive to temperature variation at long wavelengths, in particular, in the infrared depending on the sensor material. Thus, the second sensor signal gives additional information about the light source and can be used to fine tune the lux calculation.

BRIEF DESCRIPTION OF THE DRAWINGS

In the following, the principle presented above will be described in more detail with respect to drawings in which exemplary embodiments are presented.

FIG. 4 shows an exemplary flowchart of a method for temperature compensation in a light sensor arrangement according to the principle presented.

DETAILED DESCRIPTION

Figure 1:
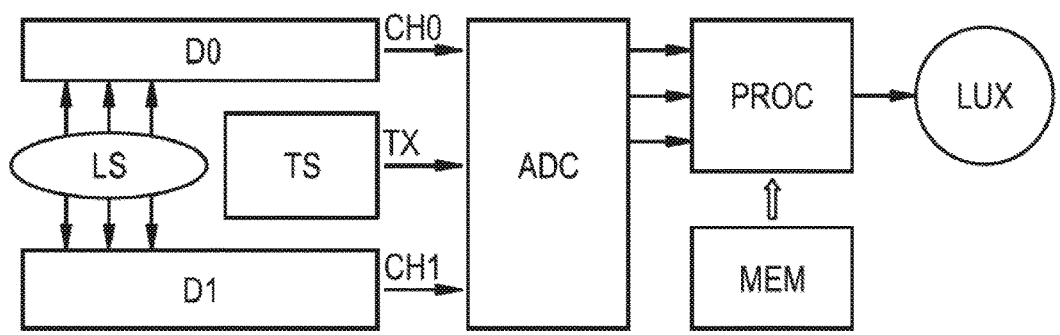
FIG. 1 shows a light sensor arrangement according to the principle presented.

FIG. 1 shows an exemplary embodiment of a light sensor arrangement according to the principle presented. The arrangement comprises a first photodiode D0 and a second photodiode D1. Both photodiodes D0, D1 further comprise a first and second well in a substrate P, respectively. The sensor arrangement, in particular, the photodiodes D0, D1 and the substrate P are covered by a transparent cover TC which itself is partly covered with a shield SH. The latter two components are not shown in FIG. 1 and will be discussed in more detail below. The first photodiode D0 is unshielded and exposed to light incident on the sensor arrangement. The second photodiode D1, on the contrary, is shielded from incident light by means of the shield SH.

Associated with the first and second photodiode D0, D1 is a temperature sensor TS which, in this exemplary embodiment, is embedded into the same substrate P and, thus, into the same die. However, the temperature sensor TS can be a separate from the photodiodes D0, D1, but generally is configured to measure a substrate temperature. Preferably, the temperature sensor TS comprises a temperature diode in the same substrate P using the same pn-junction as the photodiodes D0, D1. The temperature sensor TS is then closely positioned near the photodiodes D0, D1 on the same die. A closely spaced temperature sensor TS will help monitor photodiode junction temperature very accurately. The temperature sensor TS can sense the junction temperature while the photodiodes collect the sensor signals Ch0, Ch1.

Coupled to the photodiodes D0, D1 and the temperature sensor TS is an analog-to-digital converter ADC. An output side of the analog-to-digital converter ADC is coupled to a processing unit PROC. The processing unit PROC preferably is a microprocessor or logic.

The processing unit PROC is also coupled to a memory MEM. The memory MEM, preferably a digital memory, comprises calibration data based on temperature variation of the light sensor arrangement which has been characterized and stored into the memory either by means of a table or by a formula. The calibration data was recorded beforehand, either by the customer or during production of the sensor arrangement. Hereinafter the term sensor responsivity refers to the response of the light sensor arrangement in terms of a first and second sensor signal.

Finally, an output side of the processing unit PROC is coupled to a calculation unit LUX.

The photodiodes D0, D1 collect photons from a light source LS. The photons induce respective photocurrents in the first and second photodiode D0, D1 which are measured as the first and second sensor signals Ch0, Ch1, respectively. At the same time, or in a separate temperature measurement mode of operation, the temperature sensor TS generates a temperature-current which is measured as a temperature signal Tx. The temperature signal Tx indicates the substrate temperature.

In an embodiment not shown, the temperature can be measured in the separate temperature measurement mode of operation. Preferably, a bandgap of the photodiodes D0 or D1 can be reconfigured such that either first or second sensor signal Ch0, Ch1 is generated as a digital stream pulse whose average corresponds to the substrate temperature.

The generated sensor signals, i.e. first and second sensor signal Ch0, Ch1 and temperature signal Tx are transformed into digital information by means of the analog-to-digital converter ADC. The digital representations of the first and second sensor signals Ch0, Ch1 and the temperature signal Tx are fed into the processing unit PROC for further processing.

The processing unit PROC receives digital light spectrum information as by way of the digital representations of first and second sensor signal Ch0, Ch1 of the first and second photodiodes D0, D1. Furthermore, the processing unit PROC receives temperature information via the digital representation of the temperature signal Tx.

The information thus collected by processing unit PROC is compared with the pre-stored calibration data in order to adjust for temperature variations in the first and second sensor signal Ch0, Ch1. The processing unit PROC reads from the memory MEM light spectrum and temperature adjustment information stored in the form of calibration data from a table or generated formula. Based on selected calibration data the processing unit PROC performs a temperature calibration and provides the first and second sensor signal Ch0, Ch1 as temperature compensated signals. The processing unit PROC is also configured to calculate from the first and second sensor signal Ch0, Ch1 a signal ratio Ch1/Ch0 and extends temperature calibration to said signal ratio as well. Thus, a temperature compensated signal ratio is also provided.

Finally, the calculation unit LUX receives the temperature-compensated signal ratio from the processing unit PROC and derives from that temperature-compensated signal ratio and the first and second sensor signals an accurate ambient light brightness signal based on a lux calculation algorithm.

The general scheme depicted above will be discussed in further detail with respect to the following figures and drawings. Prior to further discussion, however, a general operation principle on which all embodiments of the light sensor arrangement according to the present principle are based will be discussed below.

A light source LS emits photons of different wavelengths and is characterized by its corresponding spectrum. A photon may be absorbed by the material comprised by the light sensor arrangement. Typically, the photodiode wells D0, D1 and the substrate P discussed here are based on silicon. Therefore, when a photon of the incident light is absorbed in silicon, a hole/electron pair is generated. Such minority- or photo-carrier diffuses through the silicon lattice depending on temperature until it either recombines or encounters a diode junction. When the minority carrier encounters a photodiode junction, it can be collected as photocurrent.

Photon absorption is a random process wherein the likelihood of the photon being absorbed in silicon is a function of wavelength. An absorption distance is defined as the distance that a quantity equal to 1/e of the incident photons travel before being absorbed, wherein e represents the natural logarithm. The absorption distance of light in silicon varies greatly as a function of wavelength. For the visible wavelength in the range of 400 to 700 nm and at room temperature, the absorption distance in silicon is in the order of 3.4 μm or less. At 800 nm, in the near infrared, the absorption distance is in the order of about 8 μm. At 900 nm, the absorption distance is in the order of about 22 μm. At 1000 nm, the absorption distance is in the order of about 93 μm.

Figure 2:
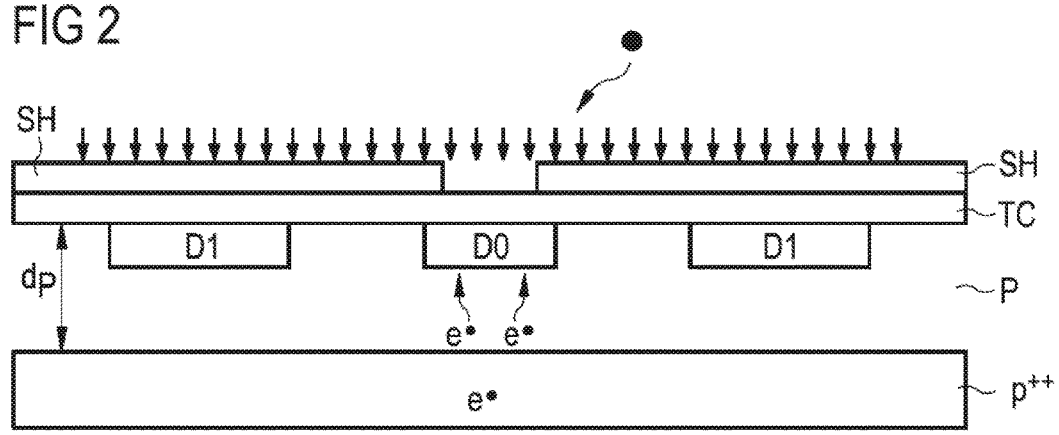
FIG. 2 shows a side view of a light sensor arrangement according to the principle presented.

FIG. 2 shows a side view of an exemplary embodiment of a light sensor arrangement according to the principle presented. Depicted are a single first, unshielded photodiode D0 flanked on its left and right side by two second, shielded diodes D1. The photodiodes D0, D1 are embedded in the common substrate P which has a depth of dp, and are covered by the transparent cover TC. The transparent cover TC is connected to a shield SH which effectively shields the second photodiodes D1 from the incident light λ. Said shield SH comprises a metal or plastic material shaped as a mask and at least partly covers the transparent cover TC. The first photodiode D0 is positioned at an aperture of the shield SH so that incident light λ can reach the photodiode D0. Below the substrate P is a further substrate layer P++ with higher doping. In this exemplary embodiment the substrate P is a p-epitaxial layer with a depth dp of about 7 μm. The further substrate layer is of highly doped p++ type. The wells of the photodiodes D0, D1 has a depth of about 3 to 4 μm.

As discussed above, for visible light in the range of 400 to 700 nm, the absorption distance of the silicon substrate material is in the order of 3.4 μm or less. The junction depth of the photodiodes D0, D1 is in the order of 3 μm. This means that the majority of incident (visible) photons will be absorbed by the unshielded photodiode D0. For longer wavelength, however, the absorption distance is much longer and about 8 μm for 800 nm (infrared). In this case both shielded and unshielded photodiodes D0, D1 will collect part of the minority carriers as photocurrent, i.e. first and second sensor signals Ch0, Ch1. Almost all photo-carriers generated within the well or the depletion region surrounding the well junction in the substrate P are collected as photocurrent. Only a small fraction will be lost due to recombination.

The diffusion of minority carriers in a silicon lattice is a random and three-dimensional process. Minority carriers generated below the well/substrate junction of the unshielded photodiode D0 may reach the shielded photodiode D1 depending on the distance from the junction. If the vertical distance below the well is small compared to the lateral dimensions of the photodiodes and the minority-carrier mean diffusion length, then it is highly probable that a photo-carrier will be collected by one of the shielded photodiodes D1 as photocurrent giving rise to a sensor signal Ch1.

As the distance below the well increases, a photo-carrier is more likely to experience significant lateral, as well as vertical diffusion. With sufficient lateral diffusion, a photo-carrier can travel far enough away from the unshielded photodiode D0 to be collected by one of the shielded photodiodes D1 adjacent to or in close vicinity of one of the unshielded photodiodes D0. If more than one shielded photodiodes D1 are adjacent to the unshielded photodiode D0, then any photo-carrier that the shielded photodiodes D1 collect will be due to photons absorbed below the photodiode junction. Accordingly, it follows that the deeper a photon is absorbed, the more likely it is to be collected by an adjacent, shielded photodiode D1 proximate to the vicinity of the unshielded photodiode D0.

The latter observation can be used to establish from the collected photocurrents in terms of first and second sensor signals Ch0, Ch1 a measure for spectral content of a given light source. In fact, the ratio of the first and second sensor signal Ch1/Ch0 is indicative of the spectral content of the light incident on the sensor arrangement. More specifically, the higher the ratio Ch1/Ch0, the greater the second sensor signal Ch1 and, thus, the long wavelength content of the light source.

Figure 3A:
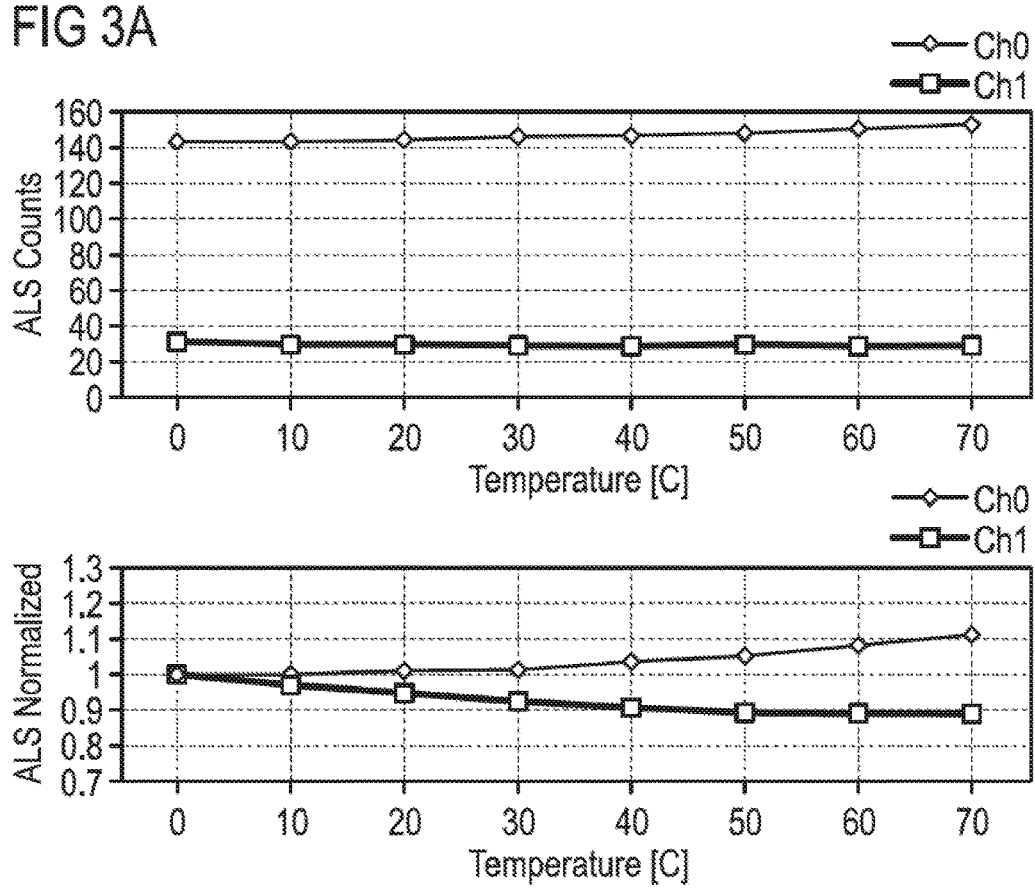
FIGS. 3A and 3B show exemplary characteristics of a light sensor arrangement according to the principle presented.

FIG. 3A shows the first and second sensor signals of a light sensor arrangement according to the present principle as a function of temperature T. Due to finite thickness of the photodiode sensors—depth dp is on the order of 7 μm—, the detection of long wavelength incident light shows variations over temperature.

In FIG. 3A the upper graph depicts the first and second sensor signals Ch0, Ch1 in units of ambient light sensor counts in an absolute scale whereas the lower graph shows the signals normalized to the respective response at 0° C. In FIG. 3A for 625 nm red light the unshielded diode D0 (see sensor signal Ch0 depicted by diamonds) shows a positive temperature coefficient, i.e. ascending slope. The second sensor signal Ch1 from the shielded photodiodes D1 show a negative temperature coefficient, i.e. descending slope (see sensor signal Ch1 depicted by squares). The two different temperature coefficients make the cancellation of long wavelength photocurrents problematic as the signal ratio Ch1/Ch0 will vary with temperature.

Figure 3B:
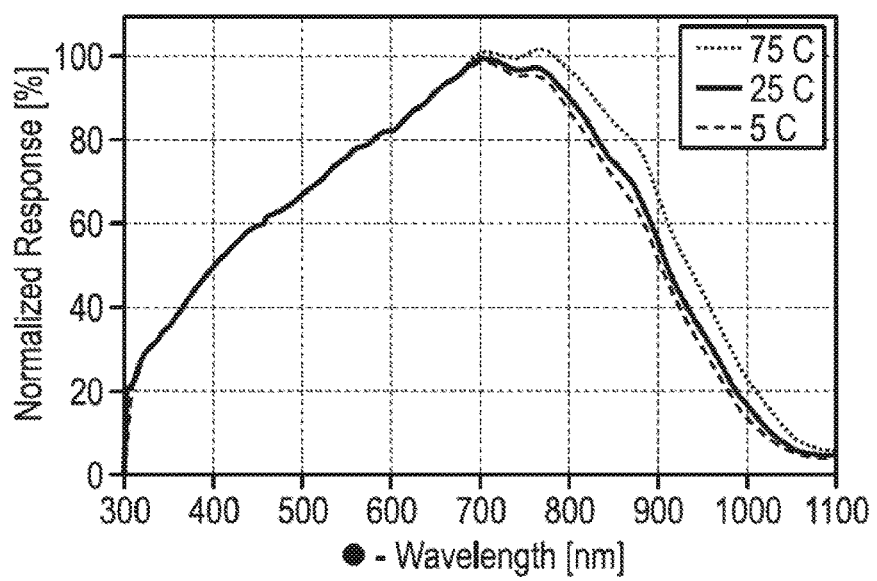

FIG. 3B shows a response curve of an unshielded photodiode in a light sensor arrangement according to the present principle as a function of wavelength. The above mentioned situation is further complicated for short and long wavelength incident light. In the case of short wavelength the sensor signal Ch0 of the unshielded photodiode D0 shows little variation over temperature. For longer wavelengths, however, the photodiode D0 shows more variation over temperature. In conclusion, the light sensor response without temperature compensation depends on the incident photon wavelength and substrate temperature.

FIG. 4 shows an exemplary flow-chart of a method for temperature compensation in a light sensor arrangement according to the principle presented. In the light sensor arrangement described with respect to FIGS. 1 and 2 the processing unit PROC performs one part of temperature compensation (steps 1 to 5). Another part is done by the calculation unit LUX (steps 6 to 8). Both functional units will be described below in further detail and in terms of their respective procedural steps.

Before operation of the light sensor arrangement and the temperature compensation starts (step 1), the calibration data needs to be collected and stored into the memory MEM. The memory can be ROM (read only, or programmed by wafer masks), RAM (the contents of memory can be loaded by customer), or fuses. The calibration data comprises pre-characterized sensor signal variations over temperature for the particular temperature sensor TS used with the light sensor arrangement.

Tables 1 and 2 show exemplary schemes to arrange the calibration data such that it can be stored in the memory MEM. Table 1 shows the normalized Ch0 diode response, expressed by coefficients amn, over temperature T0, T1, T2, . . . , Tn and signal ratios Ch1/Ch0 abbreviated as R1, R2, . . . , Rm. Table 2 shows the normalized Ch1 diode response, expressed by coefficients bmn, over temperature T0, T1, T2, . . . , Tn and Ch1/Ch0 ratios abbreviated as R1, R2, . . . , Rm. The temperatures in the two tables are T0<T1< . . . <Tn. The Ch1/Ch0 ratio is expressed by parameter R with R1<R2< . . . <Rn. The temperature T0 and ratio R1 are arbitrarily chosen as reference, for example at room temperature. All other responsivity variation data at (Ti, Rj) are normalized to responsivity data at (T0, R1) for convenience.

TABLE 1 calibration data of unshielded photodiode D0

|    | T0  | T1  | T2  | ... | Tn  |
|----|-----|-----|-----|-----|-----|
| R1 | 1   | a11 | a12 | ... | a1n |
| R2 | a20 | a21 | a22 | ... | a2n |
| ... | ... | ... | ... | ... | ... |
| Rm | am0 | am1 | am2 | ... | amn |

TABLE 2 calibration data of shielded photodiode D1

|    | T0  | T1  | T2  | ... | Tn  |
|----|-----|-----|-----|-----|-----|
| R1 | 1   | b11 | b12 | ... | b1n |
| R2 | b20 | b21 | b22 | ... | b2n |
| ... | ... | ... | ... | ... | ... |
| Rm | bm0 | bm1 | bm2 | ... | bmn |

Typically, the unshielded photodiode D1 has higher responsivity at higher temperature and the shielded photo diode has lower responsivity at lower temperature. Generally, the diode responsivity variation over the temperature can also be expressed by an equation, a formula or others. The term "responsivity" denotes particular first and second sensor signals Ch0, Ch1 at a given temperature.

The ambient light sensor arrangement is initialized (step 1) and starts from both shielded and unshielded photodiodes D0, D1 receiving ambient light (step 2). While both photodiodes D0, D1 collect photons, first and second sensor signals Ch0, Ch1 are generated (step 31), respectively. At the same time or immediately following the preceding step the temperature sensor TS monitors the photodiode junction temperature (step 32). Preferably, both steps 31 and 32 include digitalization of their respective signals Ch0, Ch1 into digital representation thereof by means of the analog-to-digital converter ADC.

At step 4 the first and second sensor signals Ch0, Ch1 or rather their digital representations get temperature compensated. At this stage of the processing flow the signal ratio Ch1/Ch0 is calculated. Then the pre-stored temperature calibration data are called as a function of signal ratio R=Ch1/Ch0 and measured substrate temperature T. First and second sensor signals Ch0, Ch1 are then mapped back into a pre-defined temperature point, for convenience, as a function of calibration coefficients amn, bmn. The correction is meant to correct the photocurrents back into a predefined temperature, for example, the room temperature when the light sensor arrangement is production tested in tester floor.

Step 4 can be summarized as follows:

1) calculate R=Ch1/Ch0

2) based on R and T (see tables 1 and 2), determine the temperature compensation amount for Ri<R<Ri+1, Tj<T<Tj+1 as:

Ch0_corrected=Ch0*aij

Ch1_corrected=Ch1*bij with i=1, ..., m and j=1, ..., n 3) calculate temperature compensated signal ratio:

R_corrected=Ch1_corrected/Ch0_corrected

4) If abs(R−R_corrected)<predefined constant: R_corrected is used as an indicator for light source and lux equation segmentation (see steps 5 to 8).

Ch0_corrected, Ch1_corrected is used in lux equation.

Stop

5) If abs(R−R_corrected)>predefined constant:

use Ch1_corrected as new Ch1; use Ch0_corrected as new Ch0;

Return the first step for iteration.

The above proposed processing flow is an iterative algorithm which stops if the absolute of R−R_corrected meets a given criterion (here: abs(R−R_corrected)<predefined constant). Otherwise a new iteration will start.

From the temperature compensated first and second sensor signals Ch0_corrected, Ch1_corrected the temperature compensated signal ratio R_corrected is calculated and used to determine the type of light source (step 5) and will be used in subsequent lux equation selection (steps 6 and 7). This step is also performed by means of the processing unit PROC. Preferably the determination is achieved by comparing the temperature compensated signal ratio R_corrected with known ratios and calibrated ratios from different light sources. These known ratios may be stored into the memory as calibration data and can be called by the processing unit PROC.

Since the longer wavelength incident light shows much significant temperature variation, Ch1's relative temperature responsivity variation gives additional information about the light source. The ambient light brightness algorithm can use Ch1's relative temperature responsivity variations to fine tune the lux calculation.

Steps 6 and 7 are performed in the calculation unit LUX which may be a unit of its own or be an integral part of the same microprocessor or logic comprising the processing unit PROC.

In step 6, a segment of a lux calculation algorithm is selected based on the temperature compensated signal ratio R_corrected and the temperature compensated first and second sensor signals Ch0_corrected, Ch1_corrected. Then a lux value corresponding to a photopic response is calculated (step 7) and the process flow end (step 8).

One possible algorithm uses a segmented equation with each segment including a linear approximation and reads as follows:

$$\text{For } 0 < (R\_corrected) \leq RC1:$$
$$Lux = c0*Ch0\_corrected - d0*Ch1\_corrected$$
$$\text{For } RC1 < (R\_corrected) \leq RC2:$$
$$Lux = c1*Ch0\_corrected - d1*Ch1\_corrected$$
$$...$$
$$\text{For } RCi < (R\_corrected) \leq RCi+1:$$
$$Lux = ci*Ch0\_corrected - di*Ch1\_corrected$$
$$\text{For } (R\_corrected) > RCn$$
$$Lux = 0,$$

wherein c0, c1, ..., ci and d0, d1, ..., di are fitting parameters with I denoting a number of segments; and RC1, RC2, ..., RCi+1 are pre-determined threshold values to define the segments. Other approximations like higher order fitting functions can be used to derive a lux value as well. However, the above approach has proven to reproduce a photopic response to a good degree. The resulting lux value is as perceived by humans and has eliminated the infrared portion of the incident which is invisible to human eyes. The algorithm and parameters can be stored onto memory MEM and called by the calculation unit LUX.

Figure 5:
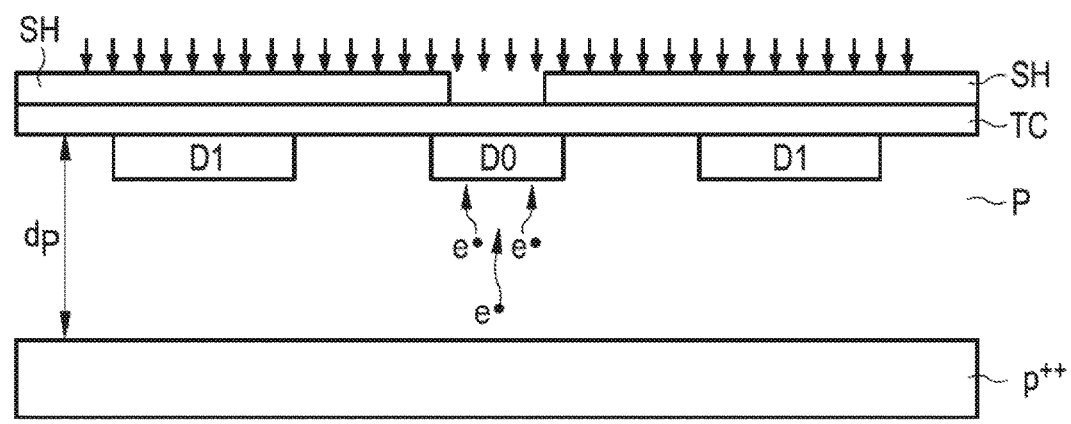
FIG. 5 shows another exemplary embodiment of a light sensor arrangement according to the principle presented.

FIG. 5 shows another exemplary embodiment of a light sensor arrangement according to the principle presented. The sensor arrangement shown here comprises temperature compensation means which are reducing the photodiode response variation due to temperature change by structural means. In other words, the sensor arrangement has lower temperature variations due to adjustments of substrate structure. The arrangement can be used together with the temperature sensor TS, processing unit PROC, memory MEM and calculation unit LUX. Due to the structural modifications, however, the latter temperature compensation means can be omitted.

The sensor arrangement is similar to the one presented with respect to FIG. 2. On the contrary, however, the photodiodes are built into a thicker epitaxial substrate P. The substrate has a depth dp adjusted to the absorption distance of the incident light in the substrate material. The substrate depth is chosen to be larger than the absorption distance at a predetermined wavelength of the incident light and at a predetermined substrate temperature.

Since the 7 μm deep substrate P or epi-layer in FIG. 2 is relatively small compared to infrared light wavelength, part of incident light will pass through the epi layer and get absorbed and lost in P++ substrate. At lower temperature, more incident light passes the p-epi layer and be absorbed/lost in P++ substrate, while at higher temperature, less incident light will pass the p-epi layer and be absorbed and lost in the P++ substrate.

This issue is solved by using a thicker lightly doped p epitaxial layer substrate P to build the photodiodes D0, D1. For thicker epitaxial substrate, the majority light will be collected in epitaxial substrate at usable temperature range (0 C to 70 C, for example), the photo diode responsivity variation due to temperature change is reasonably reduced.

REFERENCE NUMERALS 1 start of temperature compensation
2 receive light from light source
31 generate sensor signals
32 generate temperature signal
4 compensate temperature
5 determine light source
6 determine lux segment
7 determine lux value
8 end of temperature compensation
ADC analog to digital converter
Ch0 first sensor signal
Ch1 second sensor signal
D0 first well
D1 second well
e minority carrier
LS light source
LUX calculation unit
P substrate
p++ further substrate
PROC processing unit
SH shield
TC transparent cover
TS temperature sensor
TX temperature signal

What is claimed is:

1. A light sensor arrangement comprising:
   at least one first unshielded well in a substrate being exposed to incident light and configured to generate a first sensor signal as a function of the incident light;
   at least one second shielded well in the substrate being shielded from the incident light and configured to generate a second sensor signal as a function of the incident light;
   a temperature sensor for temperature compensation, the temperature sensor configured to provide the first and second sensor signals as temperature compensated sensor signals as a function of substrate temperature; and
   a processing unit configured to determine spectral content of the incident light as a function of the temperature compensated first and second sensor signals,
   wherein the at least one first unshielded well, the at least one second shielded well and the temperature sensor are embedded in the substrate, and
   wherein the at least one first unshielded well and the at least one second shielded well correspond to photodiodes, the photodiodes being respectively formed by the least one first unshielded well and the at least one second shielded well.

2. The light sensor arrangement according to claim 1, wherein the temperature sensor is configured to generate a temperature signal depending on the substrate temperature.

3. The light sensor arrangement according to claim 2, wherein the temperature sensor comprises a temperature diode comprising a third well in the substrate.

4. The light sensor arrangement according to claim 3, wherein the third well is of the same type as the at least one first unshielded well and the at least one second shielded well in the substrate.

5. The light sensor arrangement according to claim 3, wherein the at least one first unshielded well, the at least one second shielded well, and the third well comprise an n-type semiconductor, and
   wherein the substrate comprises a p-type semiconductor.

6. The light sensor arrangement according to one of claims 2 to 4,
   wherein a memory is connected to the processing unit and configured to store pre-determined calibration data referenced as a function of a reference temperature,
   wherein the processing unit is coupled to the temperature sensor and to the at least one first unshielded well and the at least one second shielded well via the substrate, respectively, to receive the temperature signal as well as the first and second sensor signal,
   wherein the processing unit comprises is configured to determine a signal ratio of the first and second sensor signal,
   wherein the processing unit comprises is configured to select calibration data from the memory as a function of the signal ratio and the reference temperature, and
   wherein the processing unit comprises is configured to provide a temperature compensated signal ratio and the temperature compensated first and second sensor signal based on the selected calibration data.

7. The light sensor arrangement according to claim 6, wherein the substrate is coupled to the processing unit via an analog-to-digital-converter,
   wherein the processing unit comprises a digital signal processor, and
   wherein the memory comprises a digital memory.

8. The light sensor arrangement according to claim 6, wherein the memory comprises a table of calibration data or a calibration formula to generate the calibration data, and
   wherein the table and formula are readable by the processing unit.

9. The light sensor arrangement according to claim 6, further comprising a calculation unit:
   connected to the processing unit to receive the temperature compensated signal ratio and the temperature compensated first and second sensor signal, and configured to determine from the temperature compensated signal ratio and as a function of the temperature compensated first and second sensor signal a type of light source emitting the incident light and/or a lux value of the incident light.

10. The light sensor arrangement according to claim 1, wherein the temperature compensation is further provided by at least one component within the substrate.

11. The light sensor arrangement according to claim 10, wherein the at least one component is positioned proximate to the at least one first unshielded well and the at least one second unshielded well in the substrate.

12. The light sensor arrangement according to claim 11, wherein the at least one component is configured to sense photodiode junction temperature corresponding to the first and second sensor signals.

13. The light sensor arrangement according to claim 1, wherein the temperature compensation is wavelength dependent, and wherein the sensor signals are wavelength dependent such that spectral content can be extracted from them.

14. A method for temperature compensation in a light sensor arrangement comprising the steps of:
    acquiring a first sensor signal by at least one first unshielded well in a substrate being exposed to incident light;
    acquiring a second sensor signal by at least one second shielded well in the substrate being shielded from the incident light;
    providing, by a temperature sensor, the first and second sensor signal as temperature compensated first and second sensor signals as a function of substrate temperature; and
    determining a spectral content of the incident light as a function of the temperature compensated first and second sensor signals,
    wherein the at least one first unshielded well, the at least one second shielded well and the temperature sensor are embedded in the substrate, and
    wherein the at least one first unshielded well and the at least one second shielded well correspond to photodiodes, the photodiodes being respectively formed by the least one first unshielded well and the at least one second shielded well.

15. The method according to claim 14, wherein the substrate temperature is determined:
    in parallel to acquiring the first and second sensor signal or
    during a temperature measurement mode of operation alternating with the acquisition of the first and second sensor signal.

16. The method according to claim 14 or 15, further comprising the steps of:
    calculating a signal ratio from the first and second sensor signal as acquired by the at least one first unshielded well and the at least one second shielded well corresponding to the photodiodes;
    selecting calibration data from a pre-determined table and/or formula, referenced as a function of the signal ratio and of a reference temperature, depending on the signal ratio and substrate temperature; and
    providing a temperature compensated signal ratio and the temperature compensated first and second sensor signal based on the selected calibration data.

17. The method according to claim 14, further comprising determining from the temperature compensated signal ratio a type of light source emitting the incident light, or determining from the temperature compensated signal ratio and as a function of the temperature compensated first and second sensor signal a lux value of the incident light.

18. The method according to claim 14, further comprising the step of determining the type of light source emitting the incident light as further function of the second sensor signal of the at least one second shielded well.

19. A light sensor arrangement comprising:
    at least one first unshielded well in a substrate being exposed to incident light and configured to generate a first sensor signal as a function of the incident light;
    at least one second shielded well in the substrate being shielded from the incident light and configured to generate a second sensor signal as a function of the incident light;
    a temperature sensor configured to provide the first and second sensor signals as temperature compensated sensor signals as a function of substrate temperature,
    wherein the substrate has a depth adjusted to the absorption distance of the incident light in the substrate material, and is chosen to be larger than the absorption distance at a pre-determined wavelength of the incident light and at a pre-determined substrate temperature; and
    a processing unit configured to determine spectral content of the incident light as a function of the temperature compensated first and second sensor signals,
    wherein the at least one first unshielded well, the at least one second shielded well and the temperature sensor are embedded in the substrate, and
    wherein the at least one first unshielded well and the at least one second shielded well correspond to photodiodes, the photodiodes being respectively formed by the least one first unshielded well and the at least one second shielded well.

* * * * *

UNITED STATES PATENT AND TRADEMARK OFFICE
CERTIFICATE OF CORRECTION

PATENT NO.         : 10,006,806 B2
APPLICATION NO.    : 14/067862
DATED              : June 26, 2018
INVENTOR(S)        : Gonggui Xu et al.

Page 1 of 1

It is certified that error appears in the above-identified patent and that said Letters Patent is hereby corrected as shown below:

In the Claims

Claim 6, Column 12:
Lines 42, 45 and 48, delete the word "comprises".

Signed and Sealed this
Tenth Day of September, 2019

Andrei Iancu
*Director of the United States Patent and Trademark Office*